United States Patent
Wada

(10) Patent No.: US 9,768,794 B1
(45) Date of Patent: Sep. 19, 2017

(54) ANALOG-TO-DIGITAL CONVERTER HAVING A SWITCHED CAPACITOR CIRCUIT

(71) Applicant: KABUSHIKI KAISHA TOSHIBA, Tokyo (JP)

(72) Inventor: Yusuke Wada, Kawasaki Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/250,824

(22) Filed: Aug. 29, 2016

(30) Foreign Application Priority Data

Mar. 14, 2016 (JP) ................... 2016-049768

(51) Int. Cl.
| H03M 1/12 | (2006.01) |
| H03M 1/34 | (2006.01) |
| H03M 1/10 | (2006.01) |
| H03M 1/24 | (2006.01) |

(52) U.S. Cl.
CPC ......... *H03M 1/245* (2013.01); *H03M 1/1009* (2013.01); *H03M 1/34* (2013.01)

(58) Field of Classification Search
CPC ................ H03M 1/1245; G11C 27/02–27/208
See application file for complete search history.

(56) References Cited

U.S. PATENT DOCUMENTS

| 5,963,156 A * | 10/1999 | Lewicki | ............... G11C 27/026 327/94 |
| 7,319,419 B1 * | 1/2008 | Lash | ................... H03M 1/0607 341/118 |
| 9,182,428 B2 | 11/2015 | Kultgen et al. | |
| 2012/0274360 A1 * | 11/2012 | Kultgen | ............ G01R 19/0023 327/67 |

FOREIGN PATENT DOCUMENTS

JP 4565273 B2 10/2010

* cited by examiner

*Primary Examiner* — Howard Williams
(74) *Attorney, Agent, or Firm* — Patterson & Sheridan, LLP

(57) ABSTRACT

An analog-to-digital converter includes a switched capacitor circuit, an analog-to-digital conversion circuit, and a constant current circuit. The switched capacitor circuit includes first and second input terminals for a differential input, and is configured to sample an analog voltage of the differential input. The analog-to-digital conversion circuit is connected to output terminals of the switched capacitor circuit, and configured to convert the sampled analog voltage into a digital signal and output the digital signal. The constant current circuit is connected to at least one of the first and second input terminals.

10 Claims, 4 Drawing Sheets

ANALOG-TO-DIGITAL CONVERTER HAVING A SWITCHED CAPACITOR CIRCUIT

CROSS-REFERENCE TO RELATED APPLICATION

This application is based upon and claims the benefit of priority from Japanese Patent Application No. 2016-049768, filed Mar. 14, 2016, the entire contents of which are incorporated herein by reference.

FIELD

Embodiments described herein relate generally to an analog-to-digital converter, in particular, an analog-to-digital converter having a switched capacitor circuit.

BACKGROUND

In related arts, an analog-to-digital converter including a switched capacitor circuit is widely employed in various fields. The analog-to-digital converter including the switched capacitor circuit samples an analog voltage as a differential input, converts the sampled analog voltage into a digital signal, and outputs the digital signal.

However, in a case where a filter circuit such as an RC filter is connected to an input terminal of the switched capacitor circuit, the input voltage for the sampling is changed due to a resistor and a time constant of the RC filter. As a result, the analog input voltage may not be accurately sampled.

DETAILED DESCRIPTION

An embodiment provides an analog-to-digital converter which can sample an analog input voltage with high accuracy even in a case where a filter circuit such as an RC filter is connected to an input terminal of a switched capacitor circuit of the analog-to-digital converter.

In general, according to an embodiment, an analog-to-digital converter includes a switched capacitor circuit, an analog-to-digital conversion circuit, and a constant current circuit. The switched capacitor circuit includes first and second input terminals for a differential input, and is configured to sample an analog voltage of the differential input. The analog-to-digital conversion circuit is connected to output terminals of the switched capacitor circuit, and configured to convert the sampled analog voltage into a digital signal and output the digital signal. The constant current circuit is connected to at least one of the first and second input terminals.

Hereinafter, embodiments will be described with reference to the drawings.

First Embodiment (Configurations)

Figure 1:
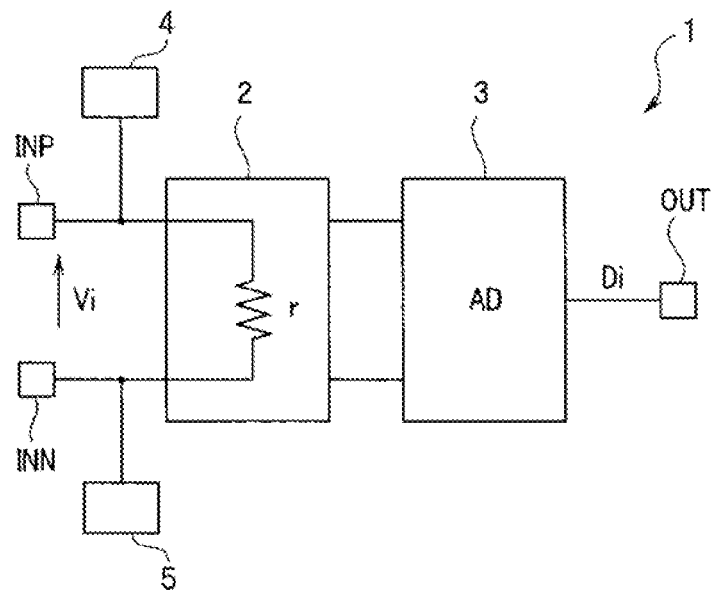
FIG. 1 is a block diagram of an analog-to-digital converter according to a first embodiment.

FIG. 1 is a block diagram of an analog-to-digital converter according to a first embodiment.

An analog-to-digital converter 1 uses a switched capacitor circuit, and includes a switched capacitor circuit 2, an analog-to-digital conversion circuit (hereinafter, referred to as "AD") 3, and constant current circuits 4 and 5. The analog-to-digital converter 1 is, for example, a semiconductor device such as a so-called analog IC.

The switched capacitor circuit 2 is of a full-differential type, includes two input terminals INP and INN as differential input terminals, and samples a voltage $V_i$ between the two input terminals INP and INN. The AD 3 converts the output voltage of the switched capacitor circuit 2 into a digital signal $D_i$.

The voltage Vi input between two input terminals INP and INN is sampled by the switched capacitor circuit 2 and input to the AD 3. The AD 3 converts the sampled voltage $V_i$ into the digital signal $D_i$ indicating the voltage value, and outputs the digital signal $D_i$ from an output terminal OUT.

Two constant current circuits 4 and 5 are connected to two input terminals INP and INN of the switched capacitor circuit 2, respectively. The constant current circuit 4 sources (that is, supplies) a constant current to a wiring connected to the input terminal INP. The constant current circuit 5 sinks (that is, draws in) the constant current from the wiring connected to the input terminal INN.

Figure 2:
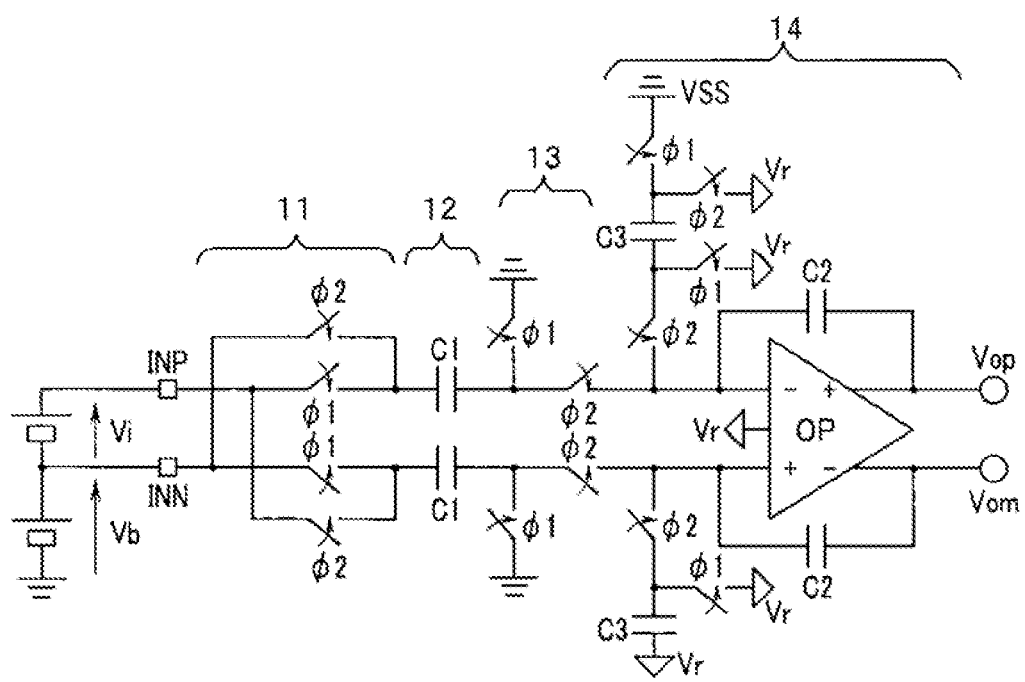
FIG. 2 is a circuit diagram of a switched capacitor circuit according to the first embodiment.
Figure 3:
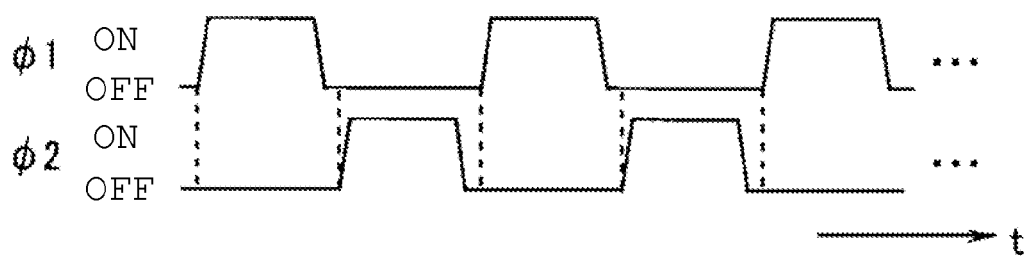
FIG. 3 is a timing chart illustrating a switching timing between ON and OFF of switches of the switched capacitor circuit illustrated in FIG. 2.

FIG. 2 is a circuit diagram of the switched capacitor circuit 2. FIG. 3 is a timing chart illustrating a switching timing between ON and OFF of switches φ1 and φ2 of the switched capacitor circuit 2 illustrated in FIG. 2.

The switched capacitor circuit 2 includes a switching section 11, a sampling capacitor section 12, a switching section 13, and an integration section 14. The respective switching sections 11 and 13 and the integration section 14 include a plurality of switches φ1 and φ2 as illustrated in FIG. 2.

The differential input voltage $V_i$ of the analog signal input between two input terminals INP and INN is supplied to the sampling capacitor section 12 through the switching section 11. Herein, a voltage $V_b$ with respect to the ground potential is input to the input terminal INN, and the difference voltage $V_i$ with respect to the voltage $V_b$ is input to the input terminal INP. The sampling capacitor section 12 includes two capacitors C1, and the switches φ1 and φ2 in the switching sections 11 and 13 are alternately turned on and off as illustrated in FIG. 3 so as to accumulate charges in accordance with the voltage $V_i$.

When the switch φ1 is turned on and the switch φ2 is turned off, the switched capacitor circuit 2 samples a voltage between the input terminals INP and INN. When the switch φ1 is turned off and the switch φ2 is turned on, the switched capacitor circuit 2 transfers the sampled charges.

Since the differential input voltage is changed in the sampling capacitor section 12, a spike current flows between the input terminals INP and INN by charging and discharging the two capacitors C1 of the sampling capacitor section 12.

Charges Q accumulated in the sampling capacitor section 12 are expressed by the following Equation (1).

$$Q = 2C_1 \times V_i \tag{1}$$

Herein, $C_1$ is an equivalent input capacitance of the capacitor C1, and $V_i$ is an input voltage.

Therefore, an average value of an input current $I_d$ flowing per one clock is expressed by the following Equation (2).

$$I_d = 2C_1 \times V_i \times f_s \tag{2}$$

Herein, $f_s$ is a frequency of sampling clocks.

The integration section 14 includes a plurality of capacitors C2 and C3, an operational amplifier OP, and the plurality of switches φ1 and φ2. A power source voltage VSS or a predetermined voltage $V_r$ can be applied to the respective capacitors C2 and C3 by the switches φ1 and φ2. The integration section 14 integrates the charges accumulated in the sampling capacitor section 12, differentially amplifies the integrated charges, and outputs the amplified signal to two output terminals Vop and Vom. The two output terminals Vop and Vom are connected to the input terminals of the AD 3.

As described above, the switched capacitor circuit 2 includes the first input terminal INP and the second input terminal INN for the differential input, samples an analog voltage of the differential input, and outputs the sampled analog voltage to the output terminals Vop and Vom. The first input terminal INP is a terminal on a higher potential side, and the second input terminal INN is a terminal on a lower potential side.

The AD 3 is an analog-to-digital conversion circuit which is connected to the output terminals Vop and Vom of the switched capacitor circuit 2, converts the sampled analog voltage into a digital signal, and outputs the digital signal.

Figure 4:
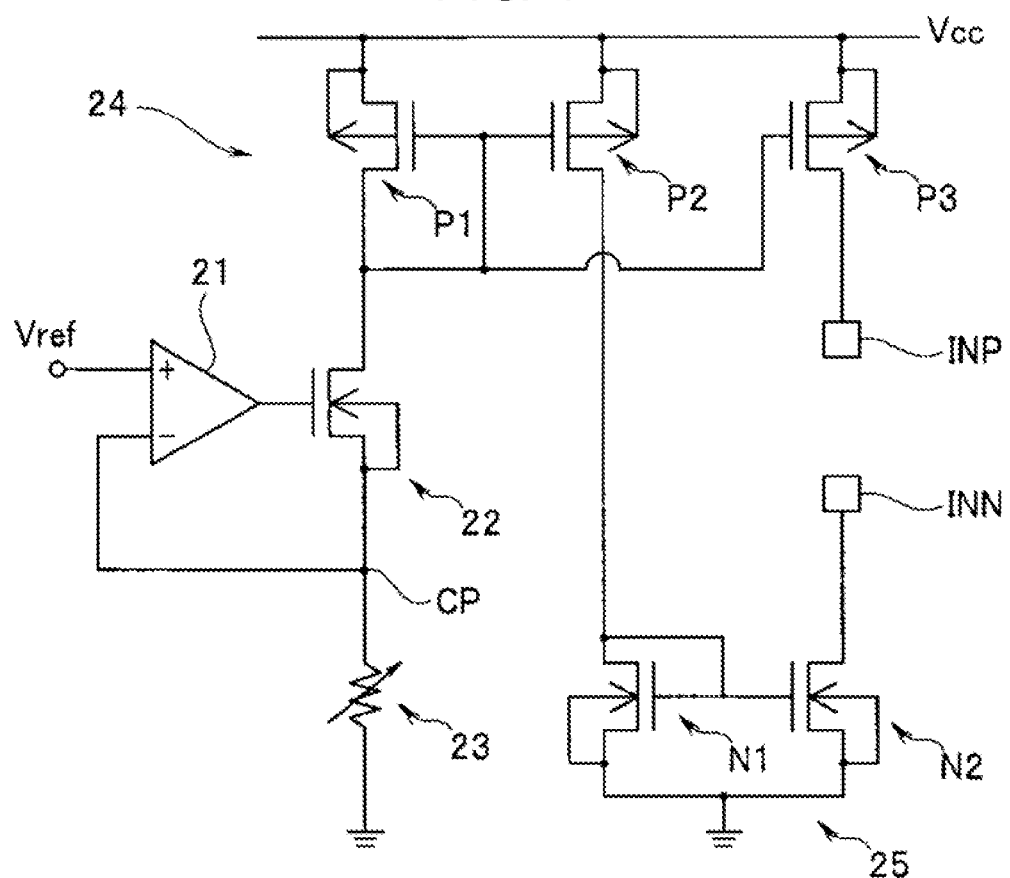
FIG. 4 is a circuit diagram of constant current circuits according to the first embodiment.

FIG. 4 is a circuit diagram of the constant current circuits 4 and 5 according to the present embodiment. The constant current is supplied from two constant current circuits 4 and 5 to two input terminals INP and INN of the switched capacitor circuit 2.

As illustrated in FIG. 4, the constant current circuits 4 and 5 include an operational amplifier 21, an NMOS transistor 22, a variable resistor 23 of which resistance is adjustable, a current mirror circuit 24 which includes three PMOS transistors P1, P2, and P3 connected in parallel to each other, and a current mirror circuit 25 which includes two NMOS transistors N1 and N2 connected in parallel to each other.

The output of the operational amplifier 21 is connected to the gate of the NMOS transistor 22. A predetermined reference voltage Vref is applied to the non-inverting input terminal of the operational amplifier 21. A joint point CP between the source of the NMOS transistor 22 and the variable resistor 23 is connected to the inverting input terminal of the operational amplifier 21.

The variable resistor 23 is a resistor of which resistance value is changeable according to an adjustment signal from the outside. The variable resistor 23 is configured to be adjusted to a resistance value in accordance with a setting signal from an external digital circuit (not illustrated) or an adjustment device 31 described below. As described below, the resistance value of the variable resistor 23 is set to be a predetermined value, so that the variable resistor 23 can output a desired constant current.

The input terminal INP is connected to the source of one of the PMOS transistors (P3 in FIG. 4) of the current mirror circuit 24. The input terminal INN is connected to the drain of the NMOS transistor N2 of the current mirror circuit 25.

(Operations)

Figure 5:
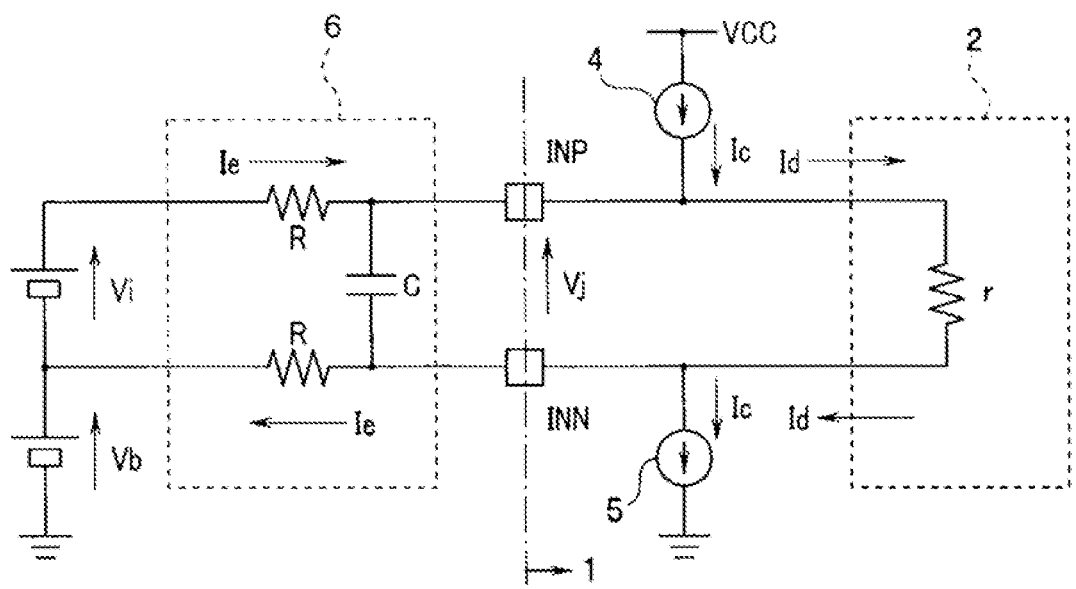
FIG. 5 is a circuit diagram for describing an operation of the switched capacitor circuit according to the first embodiment.

FIG. 5 is a circuit diagram for describing an operation of the switched capacitor circuit 2 according to the present embodiment.

As described above, the switched capacitor circuit 2 samples the differential input voltage between the input terminals INP and INN when the switch φ1 is turned on and the switch φ2 is turned off. The sampled charges are transferred when the switch φ1 is turned off and the switch φ2 is turned on.

An equivalent resistance r of the switched capacitor circuit 2 is expressed by the following Equation (3).

$$r = 1/2C_1 f_s \tag{3}$$

Herein, $C_1$ is an equivalent input capacitance of the switched capacitor circuit 2, and $f_s$ is a frequency of clocks for turning on and off the switches φ1 and φ2.

Here, it is assumed that a primary RC filter 6 is connected to the input terminals INP and INN as illustrated in FIG. 5, the constant current circuits 4 and 5 are not provided, and the input voltage $V_i$ is input to the RC filter 6. When a voltage to be input to the input terminals INP and INN of the switched capacitor circuit 2 is set to $V_j$, the input current $I_d$ of the switched capacitor circuit 2 is expressed by the following Equation (4).

$$I_d = V_j/r \tag{4}$$

In addition, when the resistance value of the respective resistors of the RC filter 6 illustrated in FIG. 5 is set to R, the input voltage $V_j$ to be input to the switched capacitor circuit 2 is expressed by the following Equation (5).

$$V_j = V_i - 2 \times R \times I_d \tag{5}$$

Therefore, the input current $I_d$ is expressed by the following Equation (6) from Equations (4) and (5).

$$I_d = V_i/(r+2R) \tag{6}$$

Therefore, the input current $I_d$ is determined by the equivalent resistance r of the switched capacitor circuit 2, the input resistance R, and the input voltage $V_i$. In addition, an error ΔV of the input voltage depends on a time constant of the RC filter 6, and expressed by the following Equation (7).

$$\Delta V = V_i - V_j = 2 \times R \times I_d \tag{7}$$

As illustrated in FIG. 5, the input current $I_d$ of Equation (6) flows in the switched capacitor circuit 2 when the voltage $V_b$ having the same phase with the measurement target input voltage $V_i$ is input to the respective two input terminals INP and INN through the RC filter 6.

When the input current $I_d$ flows to the input resistor R, the error ΔV of Equation (7) is generated. To reduce the error ΔV, according to the present embodiment, the constant current circuits 4 and 5 are used to cancel the current flowing through the input resistors R by sourcing (that is, supplying) a cancelling current $I_c$ equal to an average value of the input current $I_d$ to the input terminal INP and by sinking (that is, drawing in) the cancelling current $I_c$ equal to the input current $I_d$ from the input terminal INN.

In other words, assuming that the current flowing to the input resistor R is set to $I_e$, the current $I_d$ flowing to the equivalent resistance r of the switched capacitor circuit 2 is expressed by the following Equation (8).

$$I_e + I_c = I_d \tag{8}$$

Herein, since $I_c=I_d$, the current flowing to the input resistor R on the input terminal INP side is expressed by the following Equation (9).

$$I_e=I_d-I_c=0 \quad (9)$$

In other words, the current $I_e$ flowing to the input resistor R on the input terminal INP side can be reduced to zero.

Similarly, also the current flowing in the input terminal INN is expressed by the following Equation (10).

$$I_d=I_c+I_e \quad (10)$$

Herein, since $I_c=I_d$, the current flowing to the input resistor R on the input terminal INN side is expressed by the following Equation (11).

$$I_e=I_d-I_c=0 \quad (11)$$

As described above, the constant current circuit 4 supplies the current equal to or substantially equal to the average current flowing to the internal resistor r at the time of the switched capacitor operation of the switched capacitor circuit 2 to the circuit on the higher potential input terminal connected to the first input terminal INP. The constant current circuit 5 draws in the current equal to or substantially equal to the current flowing through the internal resistor r at the time of the switched capacitor operation of the switched capacitor circuit 2 from the circuit on the low-potential input terminal connected to the second input terminal INN. As a result, the error ΔV can be cancelled or suppressed.

Figure 6:
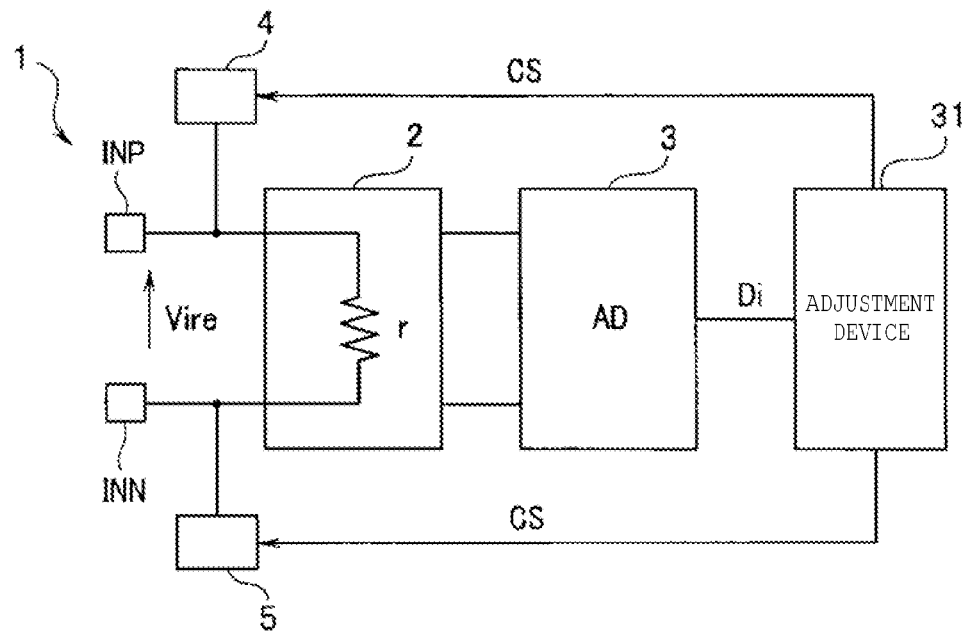
FIG. 6 is a block diagram for describing a method of setting a cancelling current according to the first embodiment.

Herein, a method of determining the cancelling current $I_c$ equal to the average value of the constant current $I_c$ output from the constant current circuits 4 and 5 (that is, the input current $I_d$) will be described. FIG. 6 describes a method of setting the cancelling current $I_c$. The adjustment device 31 is provided to receive the output of the AD 3. The adjustment device 31 is connected to the constant current circuits 4 and 5.

The constant current circuits 4 and 5 are a constant current source of which the output current is adjustable, and include an Efuse circuit for calibration in which a connection state of the resistors can be changed according to adjustment data CS received from the outside, for example.

First, the constant current circuits 4 and 5 are calibrated. First, a specific reference voltage $V_{ire}$ is applied between the input terminals INP and INN of the switched capacitor circuit 2. The adjustment device 31 receives voltage value data at that time from the AD 3. The reference voltage $V_{ire}$ is an accurate voltage of which value is known already.

The adjustment device 31 generates the adjustment data CS to cancel the difference between a value of the known reference voltage $V_{ire}$ and the received voltage value, and adjusts the resistance value of the variable resistor 23 of the constant current circuits 4 and 5. The calibration of the constant current circuits 4 and 5 is performed through a cutting process of the Efuse circuit in accordance with the adjustment data CS from the adjustment device 31.

Then, the resistance value of the variable resistor 23 is adjusted by the setting from the adjustment device 31 or an external digital circuit (not illustrated) so that the constant current circuits 4 and 5 output a constant current equal to or substantially equal to the average value of the input current $I_d$.

In other words, the specific reference voltage $V_{ire}$ (differential input voltage) is applied between the input terminals INP and INN of the switched capacitor circuit 2, and an input current Idre is measured when the cancelling current $I_c$ is 0 (zero). Since the input current $I_d$ is proportional to the differential input voltage $V_i$ in Equation (6) described above, the constant current circuits 4 and 5 output a constant current $I_c$ ($V_i$) such that the constant current $I_c$ ($V_i$) at the time of inputting the differential voltage $V_i$ becomes a value as described in the following Equation (12).

$$I_c(V_i)=I_{dre} \times V_i/V_{ire} \quad (12)$$

As described above, according to the present embodiment, it is possible to provide an analog-to-digital converter which can sample the analog input voltage with a high accuracy even when a filter circuit such as the RC filter is connected to the input terminal of the switched capacitor circuit.

Second Embodiment

While the analog-to-digital converter according to the first embodiment includes two constant current circuits, an analog-to-digital converter of a second embodiment includes one constant current circuit which is connected to the input terminal INN.

The analog-to-digital converter according to the present embodiment has a similar configuration as that of the analog-to-digital converter according to the first embodiment. The same elements will be described with the same symbols. Detailed description thereof is omitted, and only different portions will be described in detail.

Figure 7:
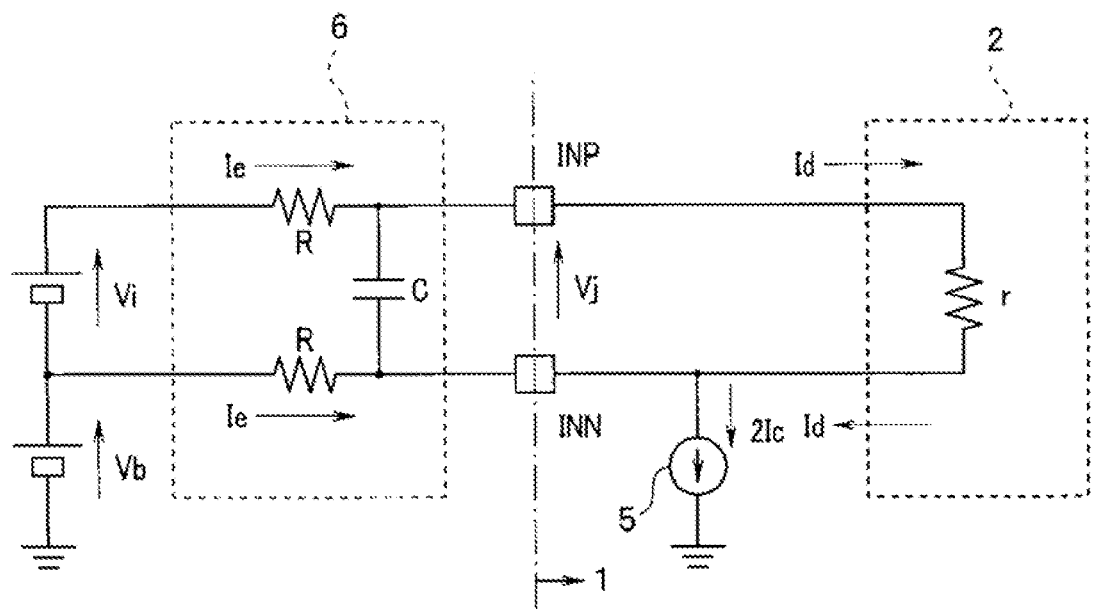
FIG. 7 is a circuit diagram for describing an operation of a switched capacitor circuit of an analog-to-digital converter according to a second embodiment.

FIG. 7 is a circuit diagram for describing an operation of the switched capacitor circuit 2 of the analog-to-digital converter according to the second embodiment. As illustrated in FIG. 7, the constant current circuit 5 is connected to the input terminal INN.

Even in the present embodiment, as illustrated in FIG. 7, it is assumed that the RC filter 6 is connected to the input terminals INP and INN of the switched capacitor circuit 2 and the constant current circuit 5 is not provided. When the differential voltage $V_i$ and the voltage $V_b$ having the same phase as that of the differential voltage $V_i$ are input to the RC filter 6, the input current $I_d$ of Equation (6) described above flows to the switched capacitor circuit 2.

As the input current $I_d$ flows to the respective input resistors R, an input voltage error ΔV of Equation (7) described above is generated. According to the present embodiment, to reduce the error ΔV, the cancelling current $2I_c$, which amounts to twice the input current $I_d$, is sunk (that is, drawn in) from the input terminal INN by the constant current circuit 5. As a result, although the current flowing to the input resistor R does not become zero, the same current can flow in the same direction through the two input resistors R of the input terminals INP and INN. Since the input voltage $V_j$ becomes equal to the differential voltage $V_i$, the error ΔV of the differential voltage can be cancelled. The current $I_e$ flowing to the input resistor R on the input terminal INP side is expressed by the following Equation (13).

$$I_e=I_d \quad (13)$$

On the other hand, the current $I_e$ flowing to the input resistor R on the input terminal INN side is expressed by the following Equation (14).

$$I_d+I_e=2I_c \quad (14)$$

Herein, since $I_c=I_d$, the current flowing to the input resistor R on the input terminal INN side is expressed by the following Equation (15).

$$I_e=I_d \quad (15)$$

Therefore, the input terminals INP and INN both can make the input current $I_d$ flow in the same direction. The differential voltage $V_j$ at that time is expressed by the following Equation (16).

$$V_j = (V_b + V_i - I_d \times R) - (V_b - I_d \times R) = V_i \tag{16}$$

Therefore, the cancelling current $2I_c$, which amounts to twice the input current $I_d$, is sunk (that is, drawn in), so that the error $\Delta V$ in the differential voltage can be cancelled.

As described above, the constant current circuit 5 draws in the current equal to or substantially equal to two times the average value of the current flowing to the internal resistor r at the time of the switched capacitor operation of the switched capacitor circuit 2 from the low-potential input terminal connected to the second input terminal INN.

The method according to the present embodiment is effectively employed in a case where the voltage $V_b$ having the same phase is high and the current cannot be sourced to the input terminal INP side.

Third Embodiment

While the analog-to-digital converter according to the first embodiment includes two constant current circuits, an analog-to-digital converter according to a third embodiment includes one constant current circuit which is connected to the input terminal INP.

The analog-to-digital converter according to the present embodiment has a similar configuration as that of the analog-to-digital converter according to the first embodiment. The same elements will be described with the same symbols. Detailed description thereof is omitted, and only different portions will be described in detail.

Figure 8:
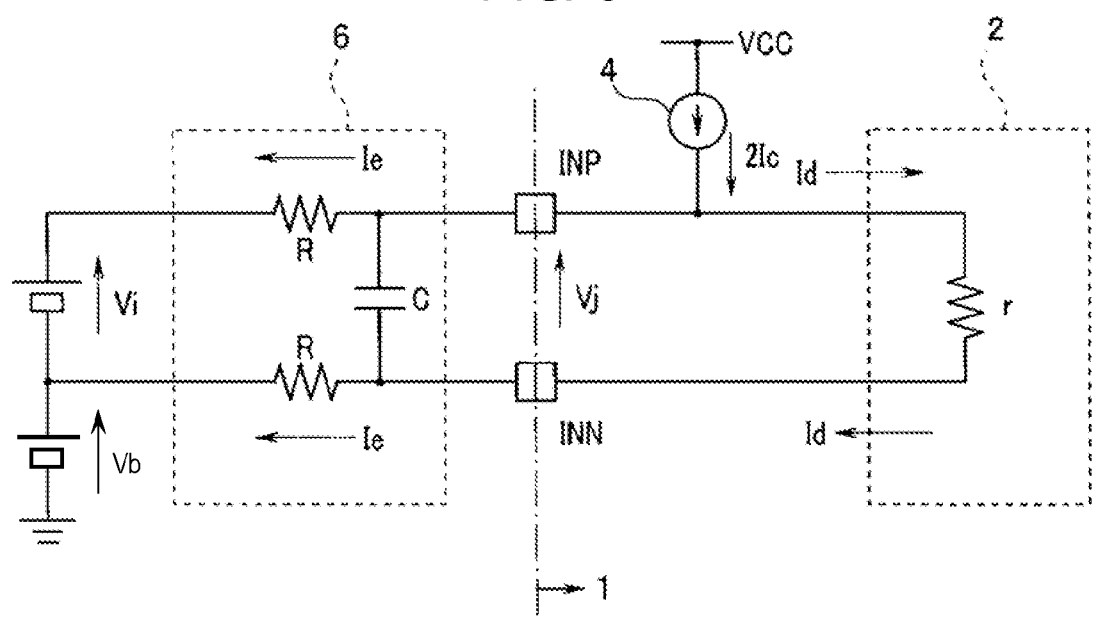
FIG. 8 is a circuit diagram for describing an operation of a switched capacitor circuit of an analog-to-digital converter according to a third embodiment.

FIG. 8 is a circuit diagram for describing an operation of the switched capacitor circuit 2 of the analog-to-digital converter according to the third embodiment. As illustrated in FIG. 8, the constant current circuit 4 is connected to the input terminal INP.

Even in the present embodiment, as illustrated in FIG. 8, it is assumed that the RC filter 6 is connected to the input terminals INP and INN of the switched capacitor circuit 2 and the constant current circuit 4 is not provided. When the differential voltage $V_i$ and the voltage $V_b$ having the same phase as that of the differential voltage $V_i$ are input to the RC filter 6, the input current $I_d$ of Equation (6) described above flows to the switched capacitor circuit 2.

As the input current $I_d$ flows to the respective input resistors R, an input voltage error $\Delta V$ of Equation (7) described above is generated. According to the present embodiment, to reduce the error $\Delta V$, the cancelling current $2I_c$, which amounts to twice the input current $I_d$, is sourced (that is, supplied) to the input terminal INP by the constant current circuit 4. As a result, although the current flowing to the input resistor R does not become zero, the same current can flow in the same direction through the two input resistors R of the input terminals INP and INN. Since the input voltage $V_j$ becomes equal to the differential voltage $V_i$, the error $\Delta V$ of the differential voltage can be cancelled.

The current $I_e$ flowing to the input resistor R on the input terminal INP side is expressed by the following Equation (17).

$$2I_c = I_e + I_d \tag{17}$$

Herein, since $I_c = I_d$, the current flowing to the input resistor R on the input terminal INP side is expressed by the following Equation (18).

$$I_e = I_d \tag{18}$$

On the other hand, the current $I_e$ flowing to the input resistor R on the input terminal INN side is expressed by the following Equation (19).

$$I_e = I_d \tag{19}$$

Therefore, the input terminals INP and INN both can make the input current $I_d$ flow in the same direction. The differential voltage $V_j$ at that time is expressed by the following Equation (20).

$$V_j = (V_b + V_i + I_d \times R) - (V_b + I_d \times R) = V_i \tag{20}$$

Therefore, the cancelling current $2I_c$, which amounts to twice the input current $I_d$, is sourced (that is, supplied), so that the error $\Delta V$ in the differential voltage can be cancelled.

As described above, the constant current circuit 4 supplies the current equal to or substantially equal to two times the average value of the current flowing to the internal resistor r at the time of the switched capacitor operation of the switched capacitor circuit 2 to the high-potential input terminal connected to the first input terminal.

The method according to the present embodiment is effectively employed in a case where the voltage $V_b$ having the same phase is low and the current cannot be sunk from the input terminal INN side.

As described above, according to the above embodiments, it is possible to provide an analog-to-digital converter which can sample the analog input voltage with a high accuracy even in a case where the filter circuit such as the RC filter is connected to the input terminal of the switched capacitor circuit.

The analog-to-digital converters according to the respective embodiment described above may be applied to monitor a battery output voltage of an electric vehicle or a hybrid vehicle.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such embodiments or modifications as would fall within the scope and spirit of the inventions.

What is claimed is:

1. An analog-to-digital converter comprising:
a switched capacitor circuit that includes first and second input terminals for a differential input, and is configured to sample an analog voltage of the differential input;
an analog-to-digital conversion circuit connected to output terminals of the switched capacitor circuit, and configured to convert the sampled analog voltage into a digital signal and output the digital signal; and
a constant current circuit that is connected to the first and second input terminals and configured to supply a first constant current having a value equal to or substantially equal to an average value of a current flowing to an internal resistor of the switched capacitor circuit during an operation of the switched capacitor circuit, to one of the first and second input terminals having a higher potential, and draw a second constant current having a value equal to or substantially equal to the average value, from the other of the first and second input terminals having a lower potential.

2. The analog-to-digital converter according to claim 1, wherein
the constant current circuit includes a first current mirror circuit including a plurality of transistors that is connected in parallel and one of which has a current-supply terminal connected to one of the first and second input terminals having a higher potential, and a second current mirror circuit including a plurality of transistors that is connected in parallel and one of which has a current-draw terminal connected to the other of the first and second input terminals having a lower potential.

3. The analog-to-digital converter according to claim 1, wherein
the values of the first and second constant currents output by the constant current circuit are changeable.

4. The analog-to-digital converter according to claim 3, wherein the constant current circuit includes a variable resistor, a resistance of the variable resistor being adjusted based on the digital signal output from the analog-to-digital conversion circuit to adjust the values of the first and second constant currents.

5. The analog-to-digital converter according to claim 1, wherein
the constant current circuit is configured to draw a current of a value equal to or substantially equal to twice an average value of a current flowing to an internal resistor of the switched capacitor circuit during an operation of the switched capacitor circuit, from one of the first and second input terminals having a lower potential.

6. The analog-to-digital converter according to claim 1, further comprising:
an RC filter circuit that is connected to the first and second input terminals and includes a first resistor connected to the first input terminal and a second resistor connected to the second input terminal, a resistance of the first resistor being equal to a resistance of the second resistor.

7. An analog-to-digital converter comprising:
a switched capacitor circuit that includes first and second input terminals for a differential input, and is configured to sample an analog voltage of the differential input;
an analog-to-digital conversion circuit connected to output terminals of the switched capacitor circuit, and configured to convert the sampled analog voltage into a digital signal and output the digital signal; and
a constant current circuit that is connected to one of the first and second input terminals having a lower potential and configured to draw a current of a value equal to or substantially equal to twice an average value of a current flowing to an internal resistor of the switched capacitor circuit during an operation of the switched capacitor circuit, from said one of the first and second input terminals having the lower potential.

8. The analog-to-digital converter according to claim 7, wherein
a value of a constant current output by the constant current circuit is changeable.

9. The analog-to-digital converter according to claim 8, wherein the constant current circuit includes a variable resistor, a resistance of the variable resistor being adjusted based on the digital signal output from the analog-to-digital conversion circuit to adjust the value of the constant current.

10. An analog-to-digital converter comprising:
a switched capacitor circuit that includes first and second input terminals for a differential input, and is configured to sample an analog voltage of the differential input;
an analog-to-digital conversion circuit connected to output terminals of the switched capacitor circuit, and configured to convert the sampled analog voltage into a digital signal and output the digital signal; and
a constant current circuit that is connected to at least one of the first and second input terminals and includes a variable resistor, a resistance of the variable resistor being adjusted based on the digital signal output from the analog-to-digital conversion circuit to adjust a value of a constant current output by the constant current circuit.

* * * * *